United States Patent [15] 3,668,554

Dupre [45] June 6, 1972

[54] YIG-TUNED SOLID STATE MICROWAVE OSCILLATOR

[72] Inventor: John J. Dupre, Sunnyvale, Calif.

[73] Assignee: Hewlett-Packard Company, Palo Alto, Calif.

[22] Filed: Mar. 29, 1971

[21] Appl. No.: 128,924

[52] U.S. Cl. ............................331/107 R, 331/99, 333/24.1

[51] Int. Cl. ..........................................................H03b 7/14

[58] Field of Search ..............................331/96, 99, 101, 107

[56] References Cited

UNITED STATES PATENTS 3,533,016 10/1970 Grace................................331/107 R 3,546,624 12/1970 Omori...............................331/107 G 3,576,503 4/1971 Hanson.............................331/107 R

*Primary Examiner*—John Kominski

*Attorney*—Roland I. Griffin

[57] ABSTRACT

A tunable solid state microwave oscillator comprising a solid state device having negative resistance characteristics connected in series with the tuning circuit of a YIG resonator, the tuning circuit in turn being connected in series with the output of the oscillator. An impedance transforming network is connected in series between the YIG-tuning circuit and the output. A selective attenuator network may be coupled between the impedance transformer network and the output.

12 Claims, 6 Drawing Figures

INVENTOR
JOHN J. DUPRE
BY Roland I. Griffin
ATTORNEY

INVENTOR
JOHN J. DUPRE
BY Roland D. Griffin
ATTORNEY

YIG-TUNED SOLID STATE MICROWAVE OSCILLATOR

BACKGROUND OF THE INVENTION

Solid state microwave sources, electronically tunable over octave ranges, are now replacing the more standard devices such as the backward wave oscillator, because of the smaller size, weight and power requirements. A promising solid state oscillator is a negative resistance device coupled via a transmission line or tuning loop to a YIG sphere. Tuning is accomplished by changing the YIG resonant frequency with a variable intensity magnetic field. One such negative resistance device is a gallium arsenide (GaAs) bulk effect device. A typical form of YIG-tuned GaAs oscillator is described in a publication entitled "The YIG-tuned Gunn Oscillator, Its Potentials and Problems" by Masahiro Omori in the 1969 IEEE G-MTT International Microwave Symposium Digest of Technical Papers. This known form of YIG-tuned oscillator employs an output coupling loop oriented orthogonally to the tuning loop for coupling the power out from the microwave oscillator to the utilization circuit. As noted in the publication, this YIG filter form of output coupling gives rise to certain problems, the most serious being the so-called non-reciprocal tuning characteristic caused by the spurious circuit oscillation. The circuit oscillation frequency — determined by the GaAs device and YIG coupling loop, but not the magnetic field — is very lightly loaded. Due to this lightly loaded condition there is a large tendency for oscillation to jump to the undesired oscillation mode. In addition, spurious oscillations unrelated to either the circuit resonance frequency of YIG resonance frequency are enhanced by this lightly loaded characteristic.

By carefully selecting GaAs devices that have negative resistance over just the right frequency range, the problems mentioned above could be minimized. Such a selection process increases the cost of manufacture.

SUMMARY OF THE INVENTION

In the present invention a novel YIG-tuned solid state oscillator is provided wherein the solid state diode is heavily loaded over a broad frequency range so that the tendency to jump to a spurious mode of oscillation is substantially inhibited.

In its basic form, the microwave oscillator comprises a solid state diode having negative resistance characteristics, such as a Gunn diode or Impatt diode, coupled to a suitable source of bias potential, the diode being connected in series with the coupling circuit, e.g. the transmission line or coupling loop, of the YIG resonator, the coupling circuit in turn being coupled in series with the output of the oscillator leading to the utilization circuit. In a preferred embodiment, an impedance transformer network is coupled in series between the YIG coupling circuit and the output.

In one form of the oscillator the bias potential is coupled to the diode via a quarter wave transmission line and associated r.f. bypass capacitor; in another form an r.f. choke is utilized in lieu of the quarter wave line.

When the oscillator is connected to a load with a high VSWR above and/or below, the tuning range of the oscillator, as is the case when feeding the utilization circuit through a ferrite circulator, a selective attenuator network is coupled in series between the impedance matching network the the circulator. In one embodiment, this selective attenuator comprises a half wave long transmission line and a pair of branch circuits each including a resistor and quarter wave shorted stub.

DESCRIPTION OF THE PREFERRED EMBODIMENTS

Figure 1:
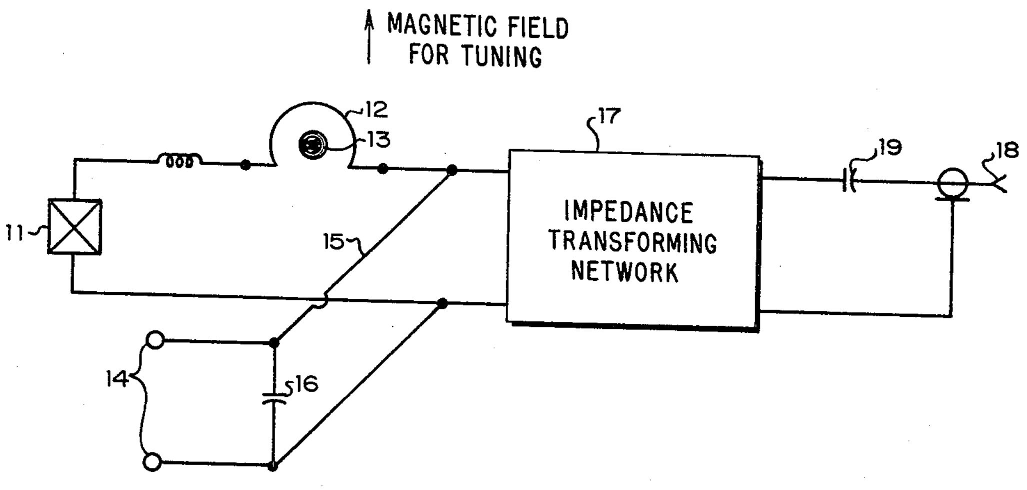
FIG. 1 is a schematic diagram of one YIG-tuned solid state microwave oscillator of the present invention.

Referring now to FIG. 1, the negative resistance solid state device 11, which may be a GaAs bulk effect device or an Impatt diode, is connected in series with the coupling circuit 12 of a YIG resonator including the YIG sphere 13. The connection to the solid state device may be made by a small diameter (e.g., 1 mil) wire or a thin ribbon or mesh (e.g., 1 mil by 5 mils in cross section) of short length (e.g., less than 100 mils), which may be adjusted for optimum performance of the oscillator. The coupling circuit 12 may be a transmission line adjacent to the sphere or a coupling loop partially or completely encircling the sphere. The YIG resonator structure includes magnet means (not shown) for producing a magnetic field for the YIG resonator, the strength of this magnetic field being variable by an electrical control voltage to tune the YIG resonator and thus the oscillator over its operating frequency band, e.g. 8 to 12 GHz, in well known manner.

A source of bias potential 14 is coupled to this series circuit via a transmission line 15 one-quarter wavelength long at the band center of the oscillator and an r.f. bypass capacitor 16.

An impedance transforming network 17 is connected between the YIG coupling loop 12 and the output terminal 18 leading to the utilization device. A d.c. blocking capacitor 19 is provided for blocking the bias potential from the load.

Figure 1A:
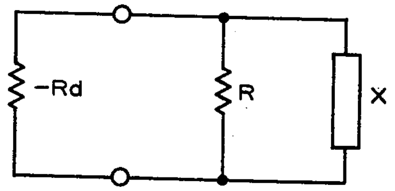
FIG. 1A is a block diagram of a simplified model of the oscillator of FIG. 1.

To demonstrate the loading characteristics of this circuit refer to the very simplified oscillator model of FIG. 1A. The circuit impedance consisting of the load resistance modified by the impedance transforming network, the YIG resonant structure, parasitics, and the solid state device reactance are represented by the parallel connection of a resistance, R, and a reactance, X. The solid state device negative resistance is represented by $-R_d$. All three elements are functions of frequency and amplitude. For stable oscillation, $X=0$ and $R_d=R$. A high value of $R$ infers light loading.

In one embodiment in which the active device is a GaAs bulk effect device, $R$ ranges from 100 to 150 ohms over the broad frequency range of 4 to 15 GHz except near the YIG resonant frequency. At the oscillation frequency determined by the YIG resonance the loading varies from 200 to 100 ohms over the 8 to 12 GHz operating band. Such a loading characteristic favors operation in the desired YIG-tuned mode and tends to inhibit oscillation in spurious modes.

Figure 2:
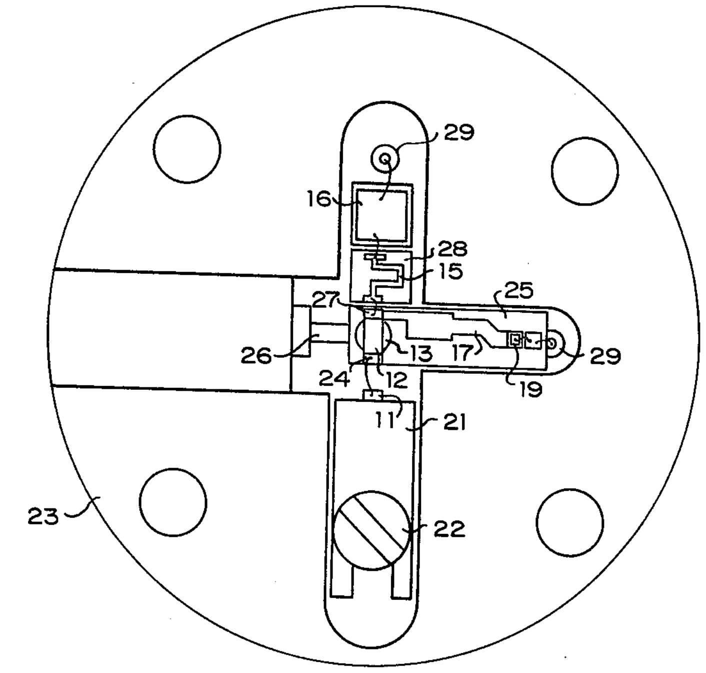
FIG. 2 is a plan view of a solid state oscillator constructed in accordance with the schematic of FIG. 1.

A structure which embodies the circuit of FIG. 1 is shown in plan view of FIG. 2 and comprises a Gunn diode 11 mounted on a heat sink 21 secured by a screw 22 to the base 23. The diode 11 is electrically coupled to one terminal 24 of the YIG coupling loop 12 mounted on a quartz substrate 25 which in turn is mounted on the base 23.

The YIG sphere 13 is positioned under the coupling loop 12 and is affixed to the end of an insulating support rod 26 mounted on the base 23 in alignment with the substrate 25 and normal to the heat sink 21 and diode 11.

The other terminal 27 of the coupling loop 12 is electrically coupled to one end of a quarter wavelength transmission line 15 on the surface of quartz substrate 28 mounted on the base 23. The other end of the transmission line 15 is electrically connected to an r.f. bypass capacitor 16 which is coupled to a feedthrough 29 leading to the device bias potential source.

Terminal 27 of the coupling loop 12 is also connected to one end of an impedance transforming network 17 consisting of a microstrip transmission line formed by a gold metalization film on the surface of the quartz substrate 25. The other end of the impedance transforming circuit 17 is coupled to one side of a d.c. blocking capacitor 19, the other side of the capacitor 19 being coupled to an r.f. feedthrough 29 leading to the output terminal of the oscillator.

Figure 3:
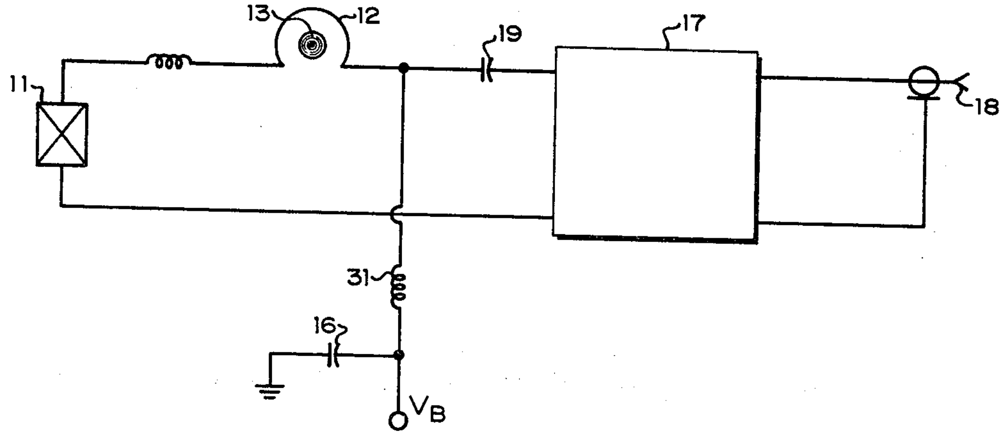
FIG. 3 is a schematic diagram of a second embodiment of the microwave oscillator.

Referring now to FIG. 3 there is shown a schematic diagram of another embodiment of the present invention. In this circuit an r.f. choke 31 is utilized to couple the bias potential to the solid state diode in lieu of the quarter wave transmission line.

Figure 4:
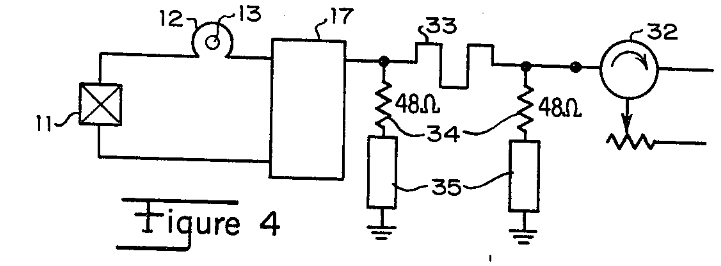
FIG. 4 is a schematic diagram of another embodiment of the present invention including a selective attenuator network.

In those cases where the oscillator is connected to a load with high VSWR above and/or below the operating band, it is desirable to use a selective attenuator network between the oscillator and the load. A ferrite circulator presents a load with that kind of VSWR characteristic. The selective attenuator network is designed to produce low attenuation within the operating band and high attenuation on either side of the band. The high out-of-band VSWR of the circulator is thus reduced and the potential spurious oscillations are eliminated. FIG. 4 shows one form of selective attenuator used to couple the impedance transformer circuit 17 to the output circulator 32.

The attenuator comprises a transmission line 33, which is one half wavelength long at a frequency, F, and a pair of branch circuits each including a resistor 34 and a shorted stub 35 which is a quarter wavelength long at frequency F. The minimum attenuation occurs at frequency F; F would typically be chosen at the frequency where output power is most critical. Most often this is the high end of the operating band.

Figure 5:
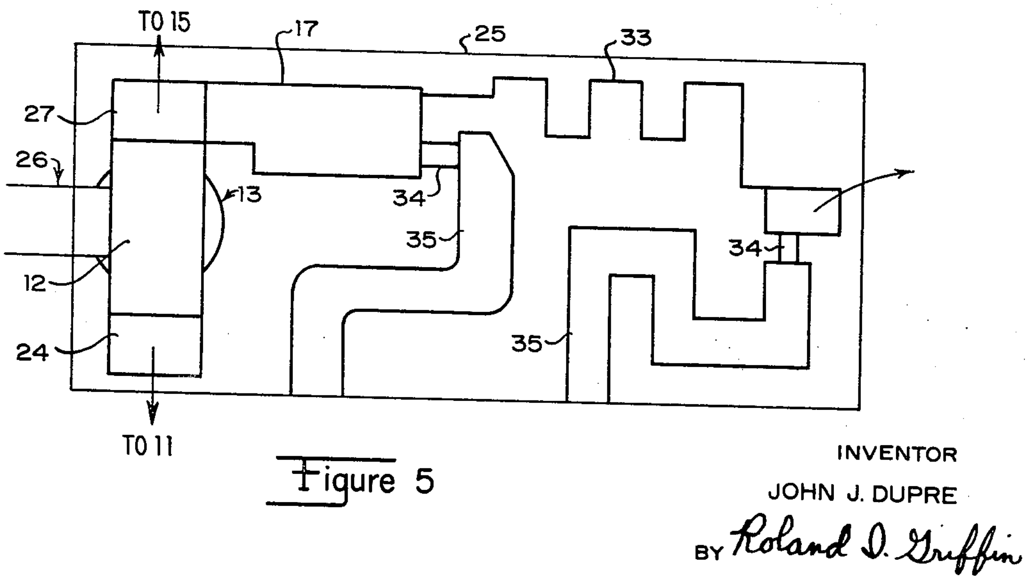
FIG. 5 is a plan view of a portion of an oscillator structure of the type shown in FIG. 4.

A microcircuit suitable for performing the attenuation is shown in FIG. 5 where only the substrate 25 of the device of FIG. 2 is shown. The impedance transformer circuit 17 is coupled to a microcircuit transmission line 33, the two ends of the line being coupled to the two branch circuits 34, 35.

I claim:

1. A tunable microwave oscillator for delivering microwave power at an output terminal thereof said oscillator comprising:
   a solid state device having negative resistance characteristics over a desired microwave frequency band;
   circuit means coupled to said solid state device for providing bias potential thereto; and
   tuning means for tuning said solid state device;
   said tuning means including
   a YIG sphere positioned for operation in a magnetic field and having a ferrimagnetic resonance characteristic tunable over said desired frequency band by variation of the intensity of said magnetic field; and
   said tuning means further including a coupling circuit connected in series with said solid state device and the output terminal of said oscillator to provide interaction between said solid state device and said YIG sphere.

2. A microwave oscillator as claimed in claim 1 including an impedance transformer circuit coupled between said coupling circuit and the output terminal of said oscillator.

3. A microwave oscillator as claimed in claim 2 wherein said coupling circuit comprises a coupling loop coupled to said YIG sphere.

4. A microwave oscillator as claimed in claim 2 wherein said coupling circuit comprises a transmission line coupled to said YIG sphere.

5. A microwave oscillator as claimed in claim 2 wherein said bias circuit means comprises means for applying d.c. potential to said solid state device and blocking the flow of a.c. current to the source of this d.c. potential.

6. A microwave oscillator as claimed in claim 5 wherein said bias circuit means comprises a transmission line substantially a quarter of a wavelength long at the center of said desired frequency r.f. band and a bypass capacitor.

7. A microwave oscillator as claimed in claim 5 wherein said bias circuit means comprises an r.f. choke and bypass capacitor.

8. A microwave oscillator as claimed in claim 2 including an attentuator circuit coupled between said impedance transformer circuit and the output of said oscillator.

9. A microwave oscillator as claimed in claim 8 including an isolator circuit coupled to the output of said oscillator.

10. A microwave circuit as claimed in claim 8 wherein said attenuator circuit comprises a transmission line and a pair of branch circuits, each including a resistor and a shorted stub.

11. A microwave circuit as claimed in claim 10 wherein said transmission line is substantially one-half wavelength long at a selected frequency and said shorted stubs are one-quarter wavelength long at the selected frequency.

12. A microwave circuit as claimed in claim 11 wherein said shorted stubs are substantially a quarter wavelength long at the high frequency end of the band and said transmission line is one half wavelength long at the high frequency end of the band.

* * * * *